United States Patent [19]
Szettella et al.

[11] Patent Number: 6,028,010
[45] Date of Patent: Feb. 22, 2000

[54] STYLE GAS RING WITH A GUARD EXTENSION

[75] Inventors: Joseph Mitchell Szettella; Jeffrey Eugene Ozee; Augusto James Gonzales; Bryan Cary Tucker, all of San Antonio, Tex.

[73] Assignees: Sony Corporation, Tokyo, Japan; Sony Electronics, Inc., Park Ridge, N.J.

[21] Appl. No.: 09/019,598

[22] Filed: Feb. 6, 1998

[51] Int. Cl.[7] .................................................. H01L 21/00
[52] U.S. Cl. .......................... 438/745; 156/345; 438/748
[58] Field of Search ......................... 156/345 LS, 345 P, 156/345 PW, 345 WH; 216/92, 67; 438/748, 710, 745; 118/715, 733

[56] References Cited

U.S. PATENT DOCUMENTS

| | | | |
|---|---|---|---|
| 4,612,432 | 9/1986 | Sharp-Geisler | 156/345 X |
| 5,494,523 | 2/1996 | Stegger et al. | 156/345 X |

*Primary Examiner*—William Powell
*Attorney, Agent, or Firm*—Ronald P. Kananen; Rader, Fishman & Grauer

[57] ABSTRACT

A ring prevents particulate build-up in a chemical spraying chamber, and includes a top portion that has a rim, and rests on a base flange of the spraying chamber, and a bottom portion that has a vertical segment that extends below a bottom surface of the base flange.

8 Claims, 4 Drawing Sheets

STYLE GAS RING WITH A GUARD EXTENSION

BACKGROUND OF THE INVENTION

Chemical spraying chambers enclose all types of chemicals, including acidic and flammable gases, so they may be utilized in a concentrated area. The enclosed area allows the gases to be applied to a subject specimen at high temperatures and/or pressures. When the chemical spraying chamber is an etching chamber, the subject specimen may be a semiconductor wafer, including a substrate upon which conductive and nonconductive layers have been formed using various deposition procedures. Conductive layers made of pure or amalgamated compounds, including metals such as copper or aluminum, may be selectively etched from parts of the semiconductor wafer by spraying reactive chemicals such as strong acids on the wafers.

Particle by-products tend to build up within the etching chamber as a result of repeated applications of chemicals to the semiconductor wafers. These by-products, though initially formed as a very thin film, gather together with time in clusters and flakes in small areas within the etching chamber. If the small flakes of particle by-products break loose during an etching operation, they may come in contact with the semiconductor wafer, producing high "particle counts". The contaminated semiconductor wafer is then inoperable, and must be discarded. To ensure that semiconductors are not mass produced having high particle counts, about every 100 or so etched semiconductors are tested. A laser counts individual particles and sums them to determine whether a wafer has a high particle count.

To prevent particle by-products from forming in clusters and flaking off into the etching chamber, maintenance is routinely performed on the chambers. Maintenance of the chambers includes major wet cleaning, during which the chamber and its components are individually decontaminated. It has been found that major wet clean interval must be performed after approximately 4000 to 5000 semiconductor wafers are etched in order to prevent high particle counts on selected wafers.

To further prevent particle by-products from forming and flaking off into an etching chamber, minor wet cleaning is performed on components of the chamber where particle clusters are most likely to form. A major problematic area where particles tend to form is in a gap produced due to a chamfer where a spring holder interfaces with a base flange. The base flange supports electromagnetic coils as well as a gas ring that covers corners of the base flange where particle by-products would otherwise accumulate. The gas ring in the prior art does not cover the gap between the spring holder and the base flange. The gap is difficult and time consuming to clean during a minor wet clean. If the chamfer is not cleaned, the semiconductor wafers produced in the chamber are likely to be contaminated by particulate by-product that comes loose from the chamfer. Spending excessive amounts of time on minor wet cleaning results in inefficient manufacture of the semiconductor wafers.

It is therefore an object of the present invention to prevent exposure of gaps, corners and chamfers where particle by-product tends to build up as a result of repeated chemical treatments on a subject, such as a semiconductor chip, within a chemical spraying chamber.

It is a further object of the invention to reduce minor wet cleaning time, thus increasing the efficiency of semiconductor wafer manufacture.

It is also an object of the invention to extend major wet clean intervals, thus further increasing the efficiency of semiconductor wafer manufacture.

SUMMARY OF THE INVENTION

The above-described needs and others are met by a gas ring for prevention of particulate build-up in a chemical spraying chamber. The gas ring is especially useful in a chemical etching chamber. In such a chamber, particulates tend to accumulate as by-product from etching metal layers off of a semiconductor substrate. The gas ring includes a top portion that has a horizontally extending rim and rests on a base flange member of the spraying chamber. The gas ring also includes a bottom portion that has a vertical segment extending below a bottom surface of the base flange. A void is inherently developed between the ring and the base flange. In a preferred embodiment of the invention, the ring may therefore also include a middle portion, having an extending segment that fills this void.

Most of the troublesome particulate build-up develops in a gap formed at an interface between the base flange and a spring holder that the base flange partially rests upon. In a preferred embodiment of the invention, the vertical segment thus may extend below a top surface of the spring holder to cover the interface between the spring holder and the base flange. The vertical segment of the ring may extend from an innermost edge of the top portion to cover the interface.

A plurality of holes may be formed in the rim of the upper portion of the ring. The holes may be formed to accept a securing means such as a bolt or screw for securing the ring to the base flange. The securing means prevents the ring from slipping or other movement. Particulate build-up is thus further prevented from accumulating in the voids the ring covers.

The above described needs and others are also met by a method for preventing particulate build up in a chemical spraying chamber, including the steps of providing a gas ring that includes some or all of the features described above, and installing the gas ring so that the top portion is resting on the base flange member of the spraying chamber, and the vertical segment extends below a bottom surface of the base flange.

DETAILED DESCRIPTION OF THE PREFERRED EMBODIMENT

Figure 1:
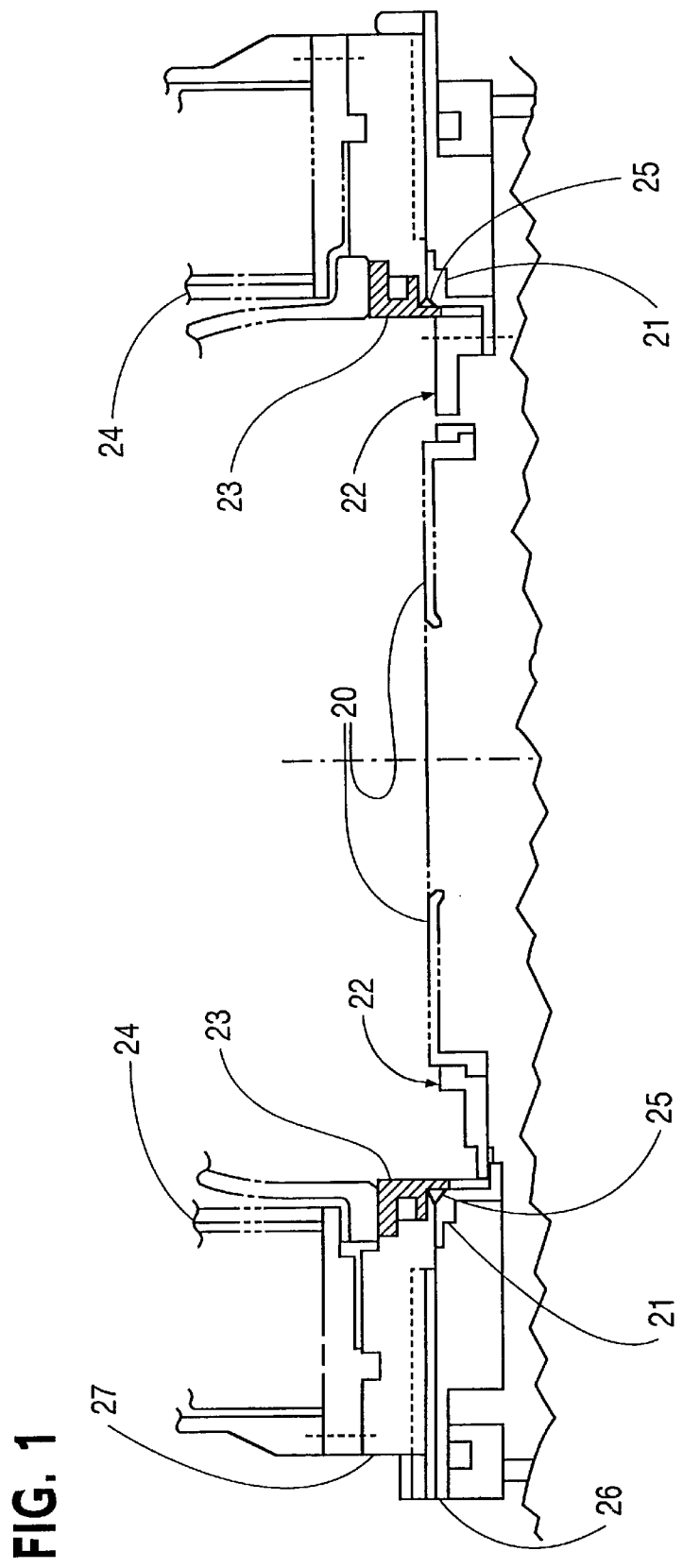
FIG. 1 shows a vertical cross sectional view of the new style gas ring as it appears resting horizontally in a Hitachi M308ATE etching chamber.

The above described needs are met by a ring for prevention of particulate build-up in a chemical spraying chamber, as shown in FIGS. 1 to 4. The ring 23 is especially useful in a chemical etching chamber generally shown in FIGS. 1 and 2. The chamber includes a platform upon which a subject such as a semiconductor wafer may be placed. Clamps 20 are provided in the chamber for securing the wafer. A base flange 27 is located at the outer edge of the chamber, and supports a plurality of electromagnetic coils 24. The base flange 27 rests upon chamber bellows 26, and on a spring holder 21. A support member 22 secures the spring holder in its position. The spring holder 21 and the base flange meet 27 at an interface where a chamfer creates a gap 25 between the base flange 27 and the spring holder 21.

Figure 2:
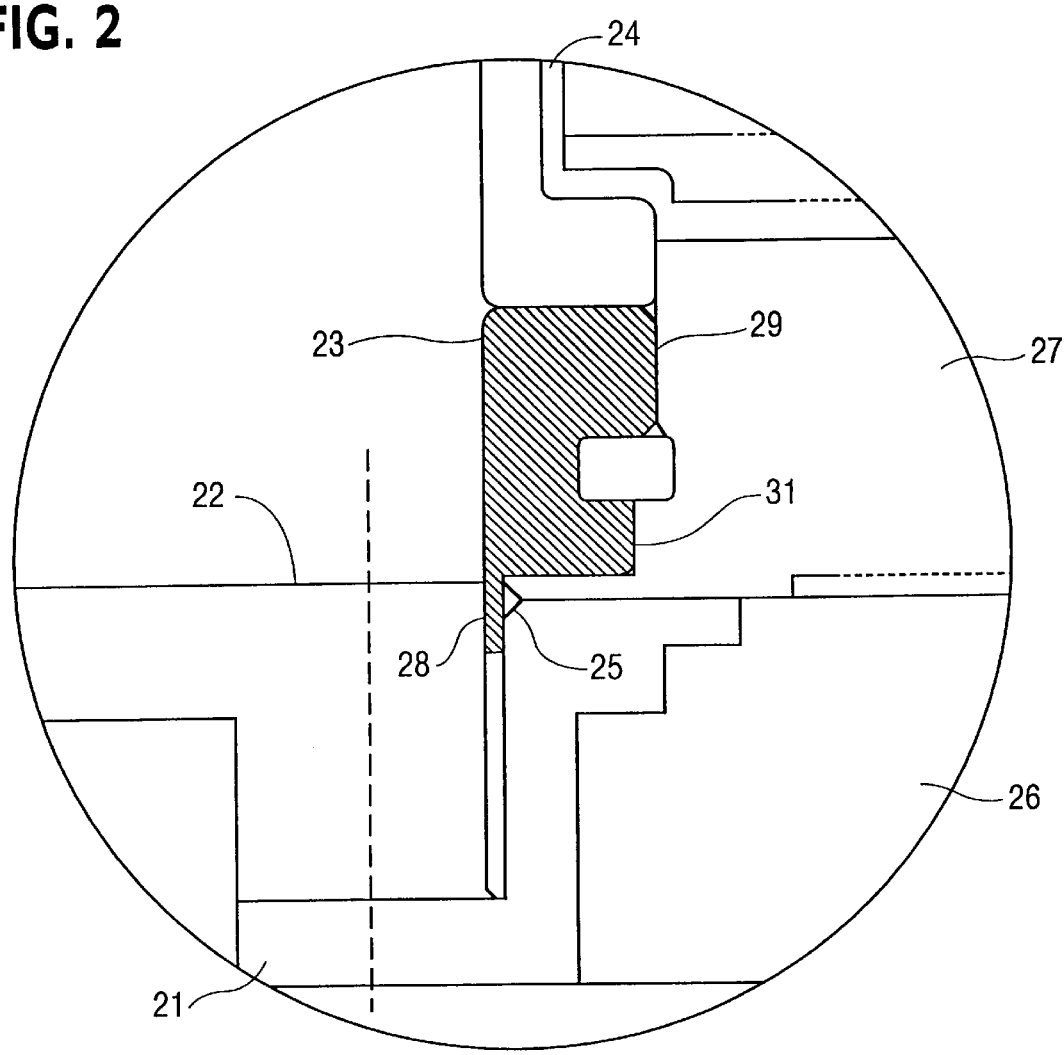
FIG. 2 shows a close up view of a vertical cross section one side of the new style gas ring as it appears resting horizontally in a Hitachi M308ATE etching chamber.
Figure 3:
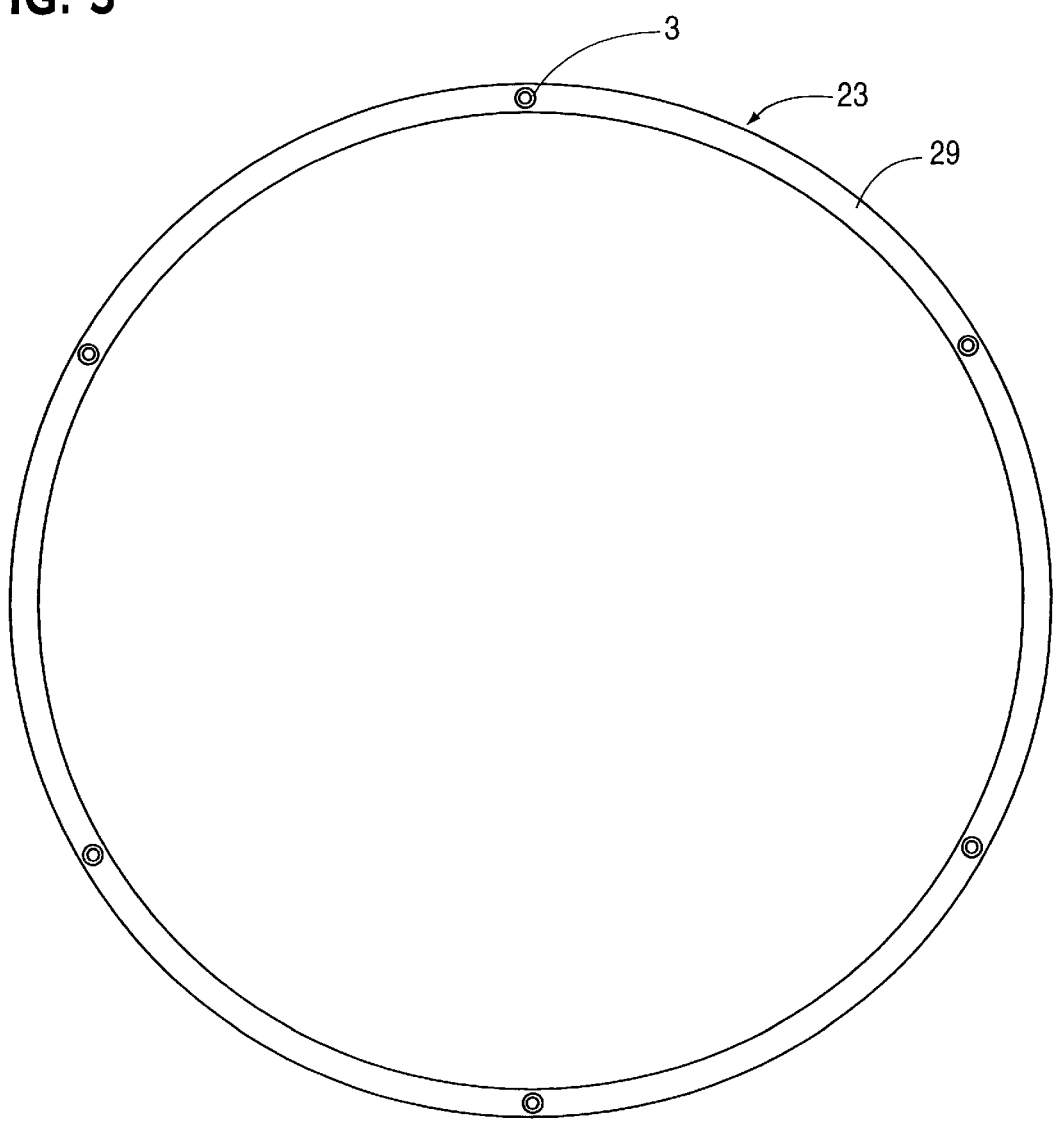
FIG. 3 shows a top view of the new style gas ring.
Figure 4:
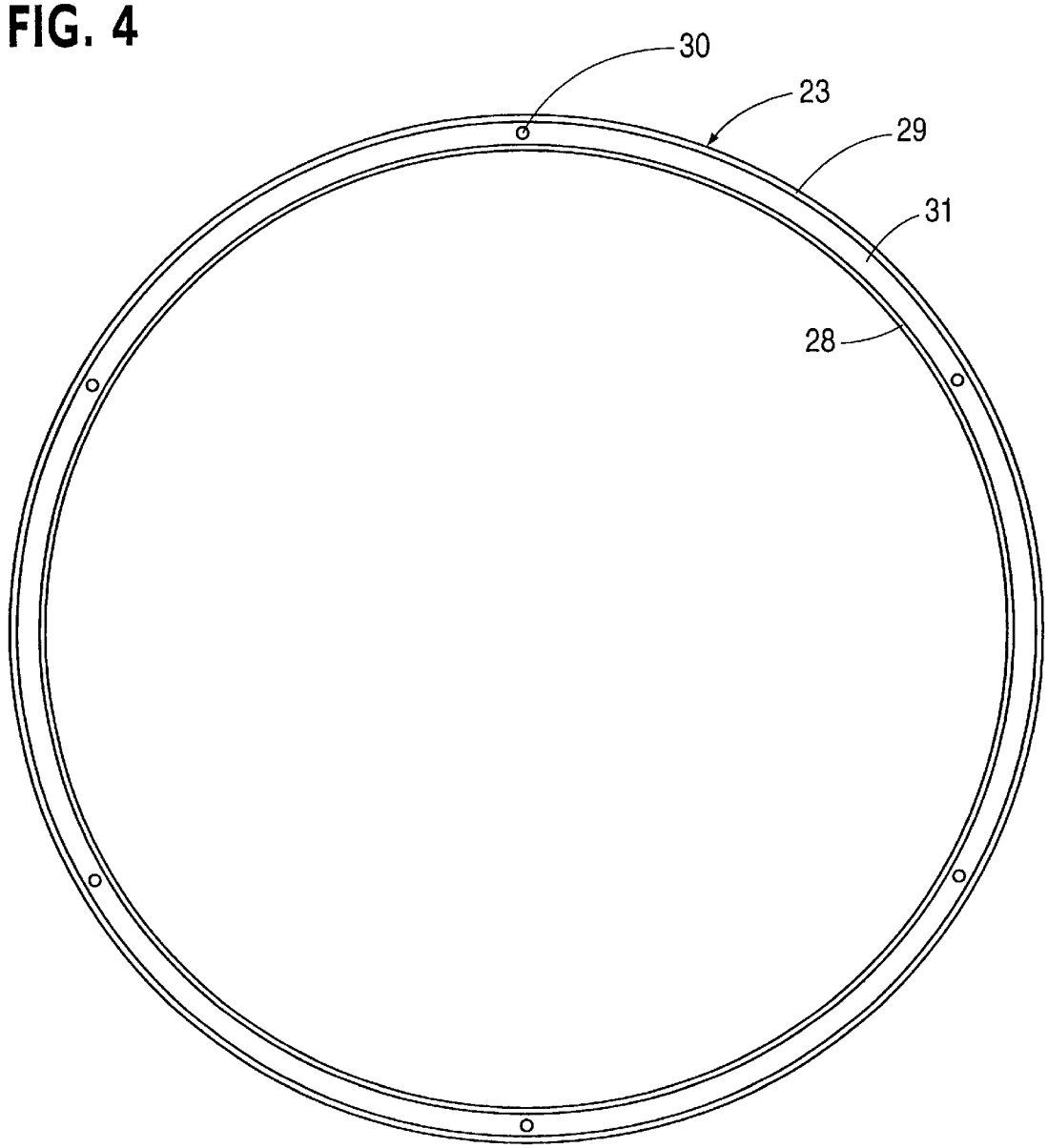
FIG. 4 shows a bottom view of the new style gas ring.

As shown in FIGS. 2, 3, and 4, the gas ring 23 includes a top portion that has a horizontally extending rim 29 that rests on the base flange of the chamber. The gas ring 23 also contains a bottom portion that includes a vertical segment 28. When the ring is in place, the vertical segment 28 extends below the gap 25 between the base flange 27 and the spring holder 21. The gap 25 is therefore protected from contact with particulate by-product resulting from chemical spray and reaction product between the chemicals sprayed and metals and other materials included on the semiconductor wafer.

In a preferred embodiment of the invention, the gas ring 23 may also include a middle portion, with an extending segment 31. The extending segment 31 serves the purpose to fill a void that would otherwise exist between the gas ring 23 and the base flange 27. The gas ring 23 therefore fits even more closely against the contours of the base flange 27, and prevents particulate by-product from forming, and eventually flaking, between the gas ring 23 and the base flange 27.

FIGS. 3 and 4 show the gas ring 23 from top and bottom views, respectively. The gas ring 23 has a plurality of holes 30 formed in the rim 29 of the upper portion of the ring 23, and extending through the middle portion 28 of the gas ring 23. The holes are formed to accept a securing means such as a bolt or screw (not shown) for securing the ring 23 to the base flange 27. Because the ring is securely fastened, voids between the ring 23 and the base flange 27 are further prevented. Particulate build-up is also further prevented from accumulating in these potential voids.

The new style gas ring was installed on a Hitachi M308ATE model, and remained installed for a typical major clean cycle (etching of 5,000 semiconductor wafers). During the cycle, semiconductor wafers were periodically tested for particle counts. With the new gas ring installed, the sum of the particles counted on each of the tested semiconductor wafers were consistently low throughout the cycle. In contrast, with the old gas ring, particle counts tend to increase as the cycle progresses until the wafers are so contaminated that they must be discarded, and the etching chamber thoroughly cleaned. Tests were also performed on the uniformity of etching and the etching rates. With the new gas ring, it appears that there is no significant impact on the etching system with respect to either etching rates or uniformity.

Having described an embodiment of the invention, it is to be understood that the invention is not limited to any of the precise embodiments described herein. Various changes and modifications could be effected by one skilled in the art without departing from the spirit or scope of the invention as defined in the appended claims.

What is claimed is:

1. A ring for prevention of particulate build-up in a chemical spraying chamber, comprising:
   a top portion, having a horizontally extending rim, resting on a base flange member of said spraying chamber; and
   a bottom portion, having a vertical segment that extends below a bottom surface of said base flange.

2. A ring as set forth in claim 1, further comprising:
   a middle portion, having an extending segment that fills a void between said ring and said base flange.

3. A ring as set forth in claim 1, wherein said vertical segment further extends below a top surface of a spring holder to cover a void located between said base flange and said spring holder.

4. A ring as set forth in claim 1, wherein said rim has a plurality of holes to accept a securer for securing said ring to said base flange.

5. A ring as set forth in claim 1, wherein said ring is used in a chemical etching chamber, and wherein said particulate build-up includes by-product from etching metal layers from a semiconductor substrate.

6. A ring as set forth in claim 1, wherein said vertical segment extends from an innermost edge of said top portion.

7. A method for preventing particulate build up in a chemical spraying chamber, comprising the steps of:
   providing a gas ring, comprising:
      a top portion, having a horizontally extending rim, and
      a bottom portion, having a vertical segment; and
   installing said gas ring whereby said top portion is resting on a base flange member of said spraying chamber, and said vertical segment extends below a bottom surface of said base flange.

8. A method for preventing particulate build up in a chemical spraying chamber as set forth in claim 7, wherein said gas ring further comprises a middle portion, having an extending segment that fills a void between said ring and said base flange.

\* \* \* \* \*